(12) United States Patent
Horiguchi et al.

(10) Patent No.: US 8,815,740 B2
(45) Date of Patent: Aug. 26, 2014

(54) METHOD FOR FORMING PATTERN AND METHOD FOR FABRICATING SEMICONDUCTOR DEVICE

(71) Applicants: Kazunori Horiguchi, Mie (JP); Takashi Ohashi, Mie (JP)

(72) Inventors: Kazunori Horiguchi, Mie (JP); Takashi Ohashi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/693,328

(22) Filed: Dec. 4, 2012

(65) Prior Publication Data

US 2014/0057441 A1 Feb. 27, 2014

Related U.S. Application Data

(60) Provisional application No. 61/692,736, filed on Aug. 24, 2012.

(51) Int. Cl.
*H01L 21/306* (2006.01)

(52) U.S. Cl.
USPC .............. 438/694; 257/E21.017; 257/E21.02; 257/E21.219; 257/E21.305; 257/E21.582; 257/E21.591; 257/E21.595; 438/689; 438/696; 438/699; 438/723

(58) Field of Classification Search
USPC .................... 257/E21.017, E21.02, E21.219, 257/E21.305, E21.582, E21.591, E21.595; 438/689, 694, 696, 699, 723
See application file for complete search history.

(56) References Cited

U.S. PATENT DOCUMENTS

2010/0029081 A1 *  2/2010  Wells et al. ................... 438/694

FOREIGN PATENT DOCUMENTS

| JP | 5-144812    | 6/1993 |
| JP | 6-61191     | 3/1994 |
| JP | 2011-171642 | 9/2011 |
| JP | 2012-4317   | 1/2012 |

* cited by examiner

*Primary Examiner* — Asok K Sarkar
(74) *Attorney, Agent, or Firm* — Oblon, Spivak, McClelland, Maier & Neustadt, L.L.P.

(57) ABSTRACT

A method for forming a pattern according to an embodiment, includes forming above a first film film patterns of a second film; forming film patterns of the first film by etching the first film using the film patterns of the second film as a mask; converting the film patterns of the second film into film patterns whose width are narrower than the film patterns of the first film by performing a slimming process; forming film patterns of a third film on both sidewalls of the film patterns of the first film and the film patterns of the second film after the slimming process; and etching the first film using the film patterns of the third film as a mask after the film patterns of the second film being removed.

19 Claims, 17 Drawing Sheets

Section A

Section B

METHOD FOR FORMING PATTERN AND METHOD FOR FABRICATING SEMICONDUCTOR DEVICE

CROSS-REFERENCE TO RELATED APPLICATION

This application is based upon and claims the benefit of priority from U.S. Patent Application No. 61/692,736 filed on Aug. 24, 2012 in U.S.A., the entire contents of which are incorporated herein by reference.

FIELD

Embodiments described herein relate generally to a method for forming a pattern and a method for fabricating a semiconductor device.

BACKGROUND

In recent years, it has become necessary, with an increasingly finer structure of a semiconductor device, to form a pattern in dimensions less than the resolution limit of exposure light. However, in conventional lithography technology, it has been difficult to form a pattern of such fine dimensions. Faced with such a problem, technology typically like sidewall processing process technology that forms a pattern in dimensions less than the resolution limit of exposure light has been adopted. In the sidewall processing process, first a film pattern to be a core material in lithography technology is formed and the core material is slimmed until the line width is reduced to half the dimension. Then, a sidewall pattern of the same width is formed on the sidewall of the core material and then the core material is removed to form a hard mask pattern of half the size of the line width formed by using lithography technology. Thus, if a film pattern to be a core material is formed in dimensions close to the resolution limit of exposure light, a hard mask in dimensions less than the resolution limit can be formed in the end.

Then, it is necessary to repeat sidewall processing twice to form a pattern ¼ the lithography exposure dimension. However, in such a technique, it is necessary to form a film for the second sidewall processing in a lower layer of film formation for the first sidewall processing. Thus, a problem such as an increased number of processes is caused. Further, increased costs due to the increased number of processes pose a problem. In addition, dimensional variations are increased by repeating the sidewall processing twice, leading to a problem of increased difficulty of dimensional control.

DETAILED DESCRIPTION

A method for forming a pattern according to an embodiment, includes forming a first film above a substrate; forming a second film above the first film; forming film patterns of the second film by processing the second film; forming film patterns of the first film by etching the first film using the film patterns of the second film as a mask; converting the film patterns of the second film into film patterns whose width are narrower than the film patterns of the first film above the first film by performing a slimming process on the film patterns of the second film; forming film patterns of a third film on both sidewalls of the film patterns of the first film and on both sidewalls of the film patterns of the second film converted after the slimming process; removing the film patterns of the second film; and etching the first film using the film patterns of the third film as a mask after the film patterns of the second film being removed.

First Embodiment

The first embodiment will be described below as a configuration in which a pattern of the pitch of ¼ the lithography exposure dimension is formed when a resist film is used as a core material and a 1:1 line and (&) space pattern is formed by lithography technology. The first embodiment will be described below by using the drawings.

Figure 1:
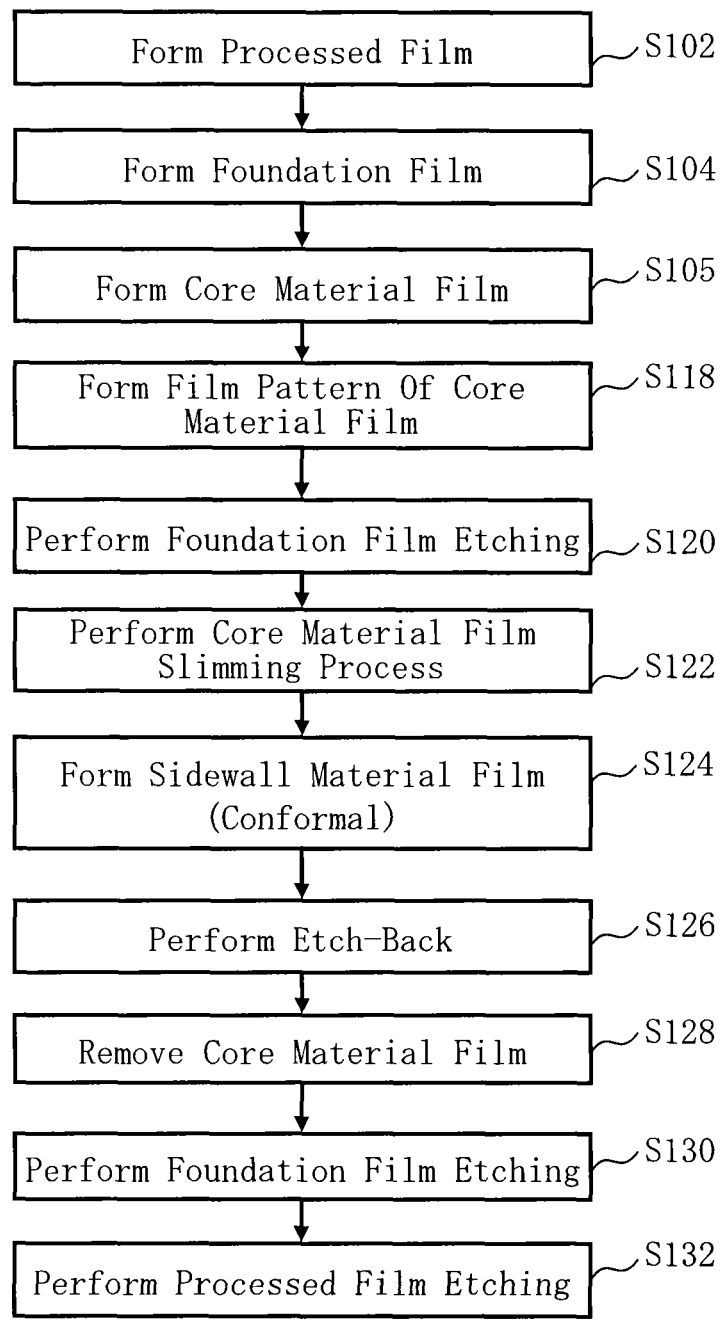
FIG. 1 is a flowchart showing principal part processes of a method for fabricating a semiconductor device according to a first embodiment.

FIG. 1 is a flowchart showing principal part processes of a method for fabricating a semiconductor device according to a first embodiment. In FIG. 1, the method for fabricating the semiconductor device according to the first embodiment executes a series of processes including a processed film formation process (S102), a foundation film formation process (S104), a core material film formation process (S105), a film pattern formation process (S118) of a core material film, a foundation film etching process (S120), a core material film slimming process (S122), a sidewall material film formation process (S124), an etch-back process (S126), a core material film removal process (S128), a foundation film etching process (S130), and a processed film etching process (S132).

FIGS. 2A to 2D are process sectional views of the method for fabricating the semiconductor device according to the first embodiment. FIGS. 2A to 2D show the processed film formation process (S102) to the core material film slimming process (S122) in FIG. 1. Subsequent processes will be described later.

Figure 2A:
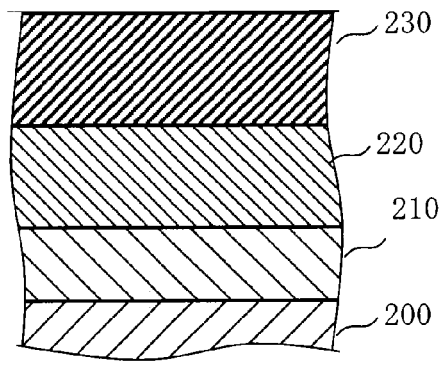
FIGS. 2A to 2D are process sectional views of the method for fabricating the semiconductor device according to the first embodiment.

In FIG. 2A, as the processed film formation process (S102), a processed film 210 to be processed is formed on a semiconductor substrate 200 (an example of the substrate) by the chemical vapor deposition (CVD) or the coating process to a thickness of, for example, 200 nm. A film containing silicon (Si) is suitable as the processed film 210. For example, an amorphous silicon (a-Si) film, silicon oxide ($SiO_2$) film, or silicon nitride (SiN) film is suitable. Here, for example, the $SiO_2$ film is used. The processed film 210 will be a film etched by using film patterns formed by a method for forming a pattern according to the first embodiment as a hard mask. A silicon wafer of, for example, 300 mm in diameter is used as the semiconductor substrate 200. Here, the illustration of a device portion is omitted. A contact layer or wiring layer may be formed on the semiconductor substrate 200. In addition, other layers may be formed.

Next, as the foundation film formation process (S104), a foundation film 220 (first film) is formed on the processed film 210 by using the CVD method or the coating process to a thickness of, for example, 100 nm. An Si containing film of a type different from types of the processed film 210 and the core material described later is suitably used for the foundation film 220. For example, an a-Si film, $SiO_2$ film, or SiN film is suitable. Here, for example, the a-Si film is used.

Next, as the core material film formation process (S105), a core material film 230 (second film) to be a core material of a sidewall processing process is formed on the foundation film 220 to a thickness of, for example, 100 nm. A material whose etching selection ratio with respect to the foundation film 220 is high is suitably used for the core material film 230. Here, for example, a resist film is suitably used as the core material film 230.

Figure 2B:
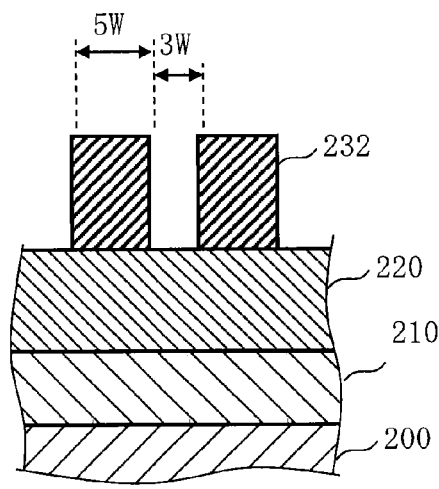

In FIG. 2B, as the film pattern formation process (S118) of a core material film, the core material film 230 is processed to form film patterns 232 of the core material film 230. Here, a resist film as the core material film 230 is exposed and developed by using lithography technology to form a resist pattern (film patterns 232) to be a substantially 5:3 line & space pattern. In the first embodiment, a substantially 1:1 line & space pattern of a width dimension W is formed as a hard mask in the end. FIG. 2B shows an example of forming a line pattern having a width 5 W, which is five times the width dimension W, and a space pattern having a width 3 W, which is three times the width dimension W. It is needless to say that such sizes of 5 W and 3 W are sizes more than the resolution limit of exposure light.

Figure 2C:
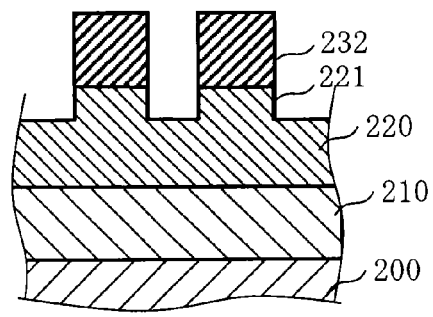

In FIG. 2C, as the foundation film etching process (S120), the foundation film 220 is etched by using, for example, dry etching to form film patterns of the foundation film 220 using the film patterns 232 of the core material film 230 as a mask. Here, the foundation film 220 is etched halfway through when etched. In other words, a step is formed in the foundation film 220. As shown in FIG. 2C, the lower step of the foundation film 220 becomes an exposed surface and the upper step thereof becomes film patterns 221 of the foundation film 220 on which the film patterns 232 of the core material film 230 are placed. By etching the foundation film 220 in this manner, the film patterns 221 of the foundation film 220 to be a substantially 5:3 line & space pattern are formed.

Figure 2D:
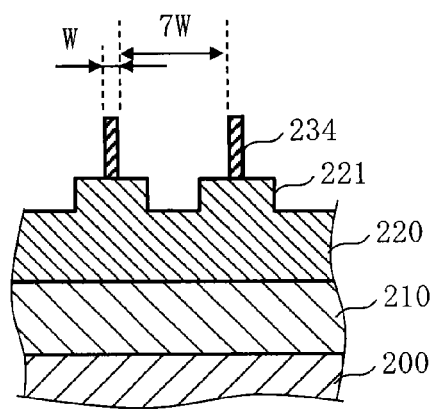

In FIG. 2D, as the core material film slimming process (S122), a slimming process of the film patterns 232 of the core material film 230 is performed to convert the film patterns 232 into film patterns 234 whose width are narrower than that of the film patterns 221 of the foundation film 220 on the foundation film 220. For example, a mixed solution of sulfuric acid and hydrogen peroxide (SPM) may be used as an etchant to slim the film patterns 232 by a wet etching process. Alternatively, the film patterns 232 may be slimmed by a dry etching process in an oxygen ($O_2$) atmosphere. Here, the film patterns 234 are formed by slimming the film patterns 232 having the dimension of the exposure size 5 W to the dimension W, which is substantially ⅕ the exposure size. By performing the slimming process of the film patterns 232 of the core material film 230, the film patterns 234 of the core material film 230 to be a substantially 1:7 line & space pattern is formed.

Figure 3A:
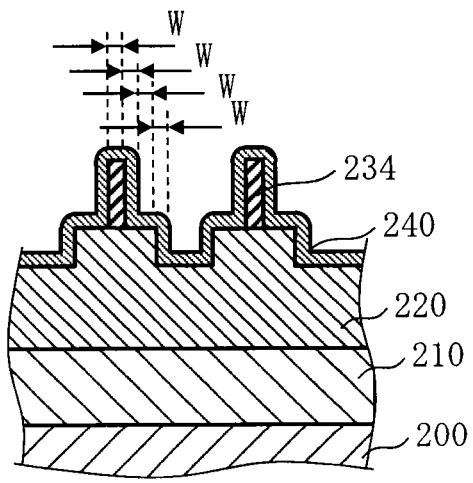
FIGS. 3A to 3C are process sectional views of the method for fabricating the semiconductor device according to the first embodiment.
Figure 3B:
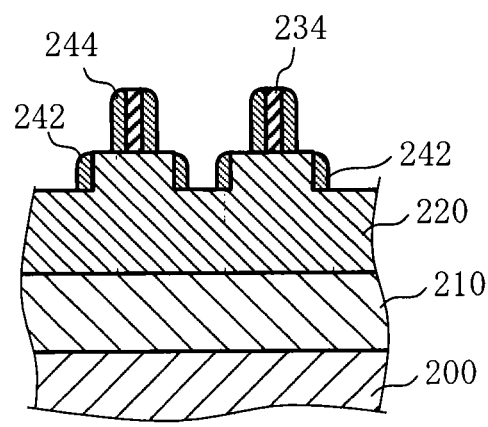
Figure 3C:
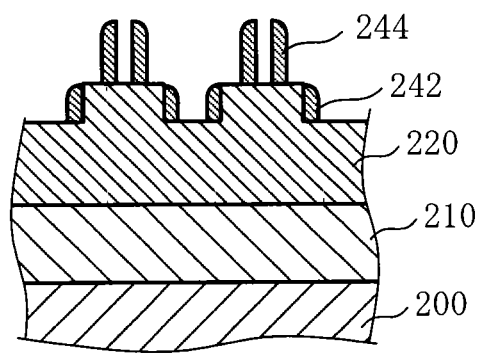

FIGS. 3A to 3C are process sectional views of the method for fabricating the semiconductor device according to the first embodiment. FIGS. 3A to 3C show the sidewall material film formation process (S124) to the core material film removal process (S128) in FIG. 1. Subsequent processes will be described later.

In FIG. 3A, as the sidewall material film formation process (S124), a sidewall material film 240 (third film) is conformally formed by using, for example, the CVD method as if to cover the foundation film 220 and the film patterns 234 of the core material film 230. A material whose etching selection ratio with respect to the foundation film 220 is high is suitably used for the sidewall material film 240. For example, a metal containing film is suitably used. For example, an aluminum nitride (AlN) film is suitably used as the metal containing film.

In FIG. 3B, as the etch-back process (S126), film patterns 242, 244 of the sidewall material film 240 are formed on both sidewalls of the film patterns 221 of the upper step of the foundation film 220 and on both sidewalls of the film patterns 234 of the core material film 230 by etching back the sidewall material film 240 until the surface of the upper step and the surface of the lower step of the foundation film 220 and the surface of the film patterns 234 of the core material film 230 are exposed.

In FIG. 3C, as the core material film removal process (S128), the film patterns 234 of the core material film 230 are removed. For example, SPM may be used as the etchant to remove the film patterns 234 by the wet etching process.

Figure 4A:
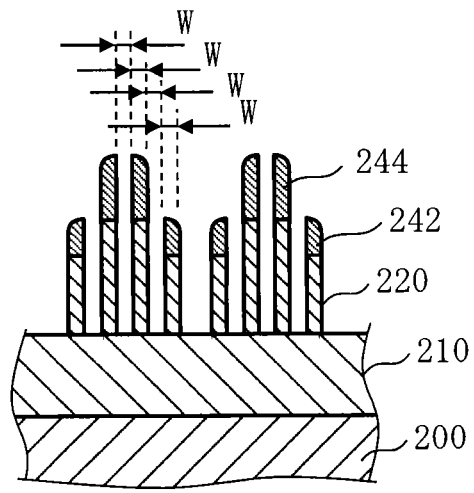
FIGS. 4A and 4B are process sectional views of the method for fabricating the semiconductor device according to the first embodiment.
Figure 4B:
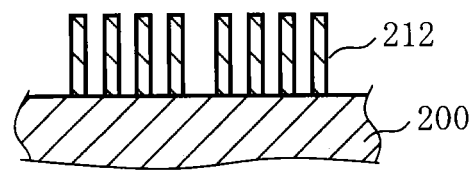

FIGS. 4A and 4B are process sectional views of the method for fabricating the semiconductor device according to the first embodiment. FIGS. 4A and 4B show the foundation film etching process (S130) and the processed film etching process (S132) in FIG. 1.

In FIG. 4A, as the foundation film etching process (S130), after the film patterns 234 of the core material film 230 being removed, the exposed foundation film 220 is etched by using the film patterns 242, 244 of the sidewall material film 240 as masks. Film patterns configured by the film patterns 242 of the sidewall material film 240 formed on both sidewalls of the film patterns 221 of the foundation film 220 and the film patterns 244 of the sidewall material film 240 formed on both sidewalls of the film patterns 234 of the core material film 230 are arranged with a substantially constant pitch. Accordingly, as shown in FIG. 4A, a substantially 1:1 line & space pattern of the dimension W, which is substantially ⅕ the line pattern size 5 W of a resist pattern formed by lithography, is formed by the film patterns 242 of the sidewall material film 240 formed on both sidewalls of the film patterns 221 of the foundation film 220, the film patterns 244 of the sidewall material film 240 formed on both sidewalls of the film patterns 234 of the core material film 230, and film patterns of the foundation film 220 formed by transfer of these film patterns. The pitch of a line & space pattern formed according to the first embodiment corresponds to ¼ the pitch when a 1:1 line & space pattern is formed by lithography technology.

According to the method for forming a pattern in the first embodiment, as described above, a line & space pattern of the pitch equal to ¼ the exposure size, which is equivalent to a case when sidewall processing is repeated twice, can be formed by performing sidewall processing once. Further, according to the first embodiment, an increase in the number of processes can be curbed. Thus, increased costs due to the increased number of processes can be avoided. In addition, dimensional variations caused by repeating sidewall processing twice can be avoided. Therefore, dimensional controllability can be improved.

In FIG. 4B, as the processed film etching process (S132), the processed film 210 is etched by using the film patterns 242 of the sidewall material film 240 formed on both sidewalls of the film patterns 221 of the foundation film 220, the film patterns 244 of the sidewall material film 240 formed on both sidewalls of the film patterns 234 of the core material film 230, and film patterns of the foundation film 220 formed by transfer of these film patterns as hard masks. Accordingly, the desired film patterns 212 of the processed film 210 can be formed.

Because dimensional accuracy of hard masks is high as described above, etching of the processed film 210 can be performed with high dimensional accuracy in the method for fabricating the semiconductor device according to the first embodiment.

In the above example, while the foundation film 220 is processed so that two steps, upper and lower steps, are formed, processing can also be performed so that no step is formed by using a material of a different type from the material of the processed film 210 formed on the surface of the semiconductor substrate 200 for the core material film 230, in other words, a material having a high etching selection ratio with respect to the processed film 210 for the core material film 230. A modification of the first embodiment in which no such step is formed will be described below. The flowchart showing principal part processes of the method for fabricating a semiconductor device according to the modification of the first embodiment is similar to that in FIG. 1. Each process from the processed film formation process (S102) to the film pattern formation process (S118) of a core material film is the same as the above-described content.

Figure 5A:
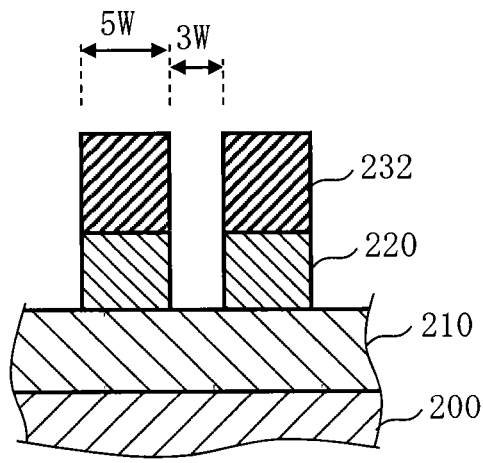
FIGS. 5A to 5C are process sectional views of the method for fabricating the semiconductor device according to a modification of the first embodiment.
Figure 5B:
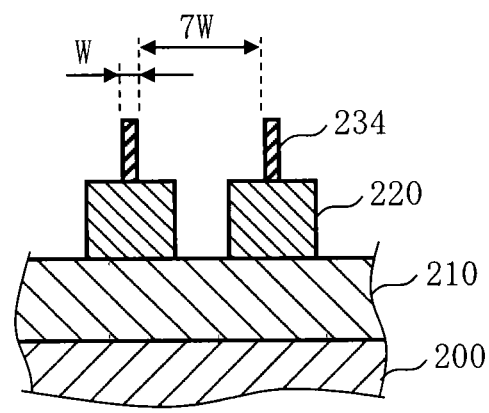
Figure 5C:
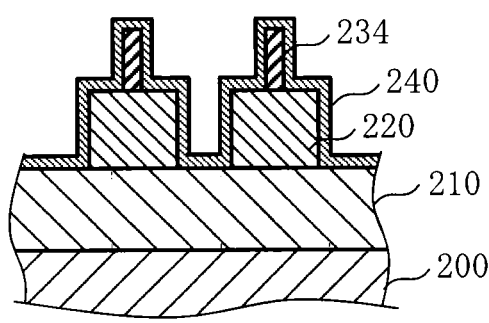

FIGS. 5A to 5C are process sectional views of the method for fabricating the semiconductor device according to the modification of the first embodiment. FIGS. 5A to 5C show the foundation film etching process (S120) to the sidewall material film formation process (S124) in FIG. 1. Subsequent processes will be described later.

In FIG. 5A, as the foundation film etching process (S120), film patterns of the foundation film 220 are formed by etching the foundation film 220 using, for example, dry etching up to the surface of the processed film 210 formed on the surface of the semiconductor substrate 200 using the film patterns 232 of the core material film 230 as a mask. Film patterns of the foundation film 220 to be a substantially 5:3 line & space pattern are formed by etching the foundation film 220.

Then, as the core material film slimming process (S122), as shown in FIG. 5B, the film patterns 234 of the core material film 230 to be a substantially 1:7 line & space pattern are formed by performing, in the same manner as described above, the slimming process of the film patterns 232 of the core material film 230.

Then, as the sidewall material film formation process (S124), as shown in FIG. 5C, the sidewall material film 240 (third film) is conformally formed in the same manner as described above by using, for example, the CVD method as if to cover the foundation film 220 and the film patterns 234 of the core material film 230.

Figure 6A:
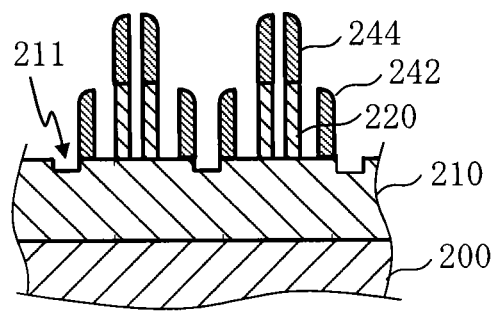
FIGS. 6A and 6B are process sectional views of the method for fabricating the semiconductor device comparing the first embodiment and the modification of the first embodiment.
Figure 6B:
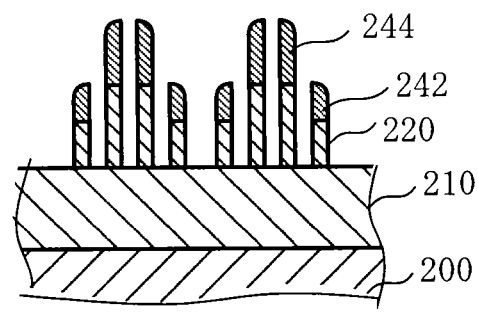

FIGS. 6A and 6B are process sectional views of the method for fabricating the semiconductor device comparing the first embodiment and the modification of the first embodiment.

By executing the etch-back process (S126) to the foundation film etching process (S130) in the same manner as described above after the sidewall material film formation process (S124), as shown in FIG. 6A, a substantially 1:1 line & space pattern of the dimension W can be formed based on the film patterns 242 of the sidewall material film 240 formed on both sidewalls of the film patterns of the foundation film 220, the film patterns 244 of the sidewall material film 240 formed on both sidewalls of the film patterns 234 of the core material film 230, and film patterns of the foundation films 220 formed by transfer of these film patterns. In the modification of the first embodiment in which no step is formed in the foundation film 220, however, as shown in FIG. 6A, the processed film 210 may also be etched due to over-etching in the foundation film etching process (S130). Thus, a recess 211 may be formed in the processed film 210.

In the first embodiment described above, by contrast, the foundation film 220 is provided with a step and thus, as shown in FIG. 6B, over-etching can be avoided in the foundation film etching process (S130). When a step is provided in the foundation film 220, the film heights of the film patterns 242 of the sidewall material film 240 formed on both sides of the film patterns of the upper step of the foundation film 220 become lower and thus, a material having a high etching selection ratio with respect to the foundation film 220 is suitable as the material of the sidewall material film 240.

Second Embodiment

A resist film is used as the core material in the first embodiment, but the core material is not limited to the resist film. In the second embodiment, a case when a material other than the resist film is used as the core material will be described. The second embodiment will be described below by using the drawings.

Figure 7:
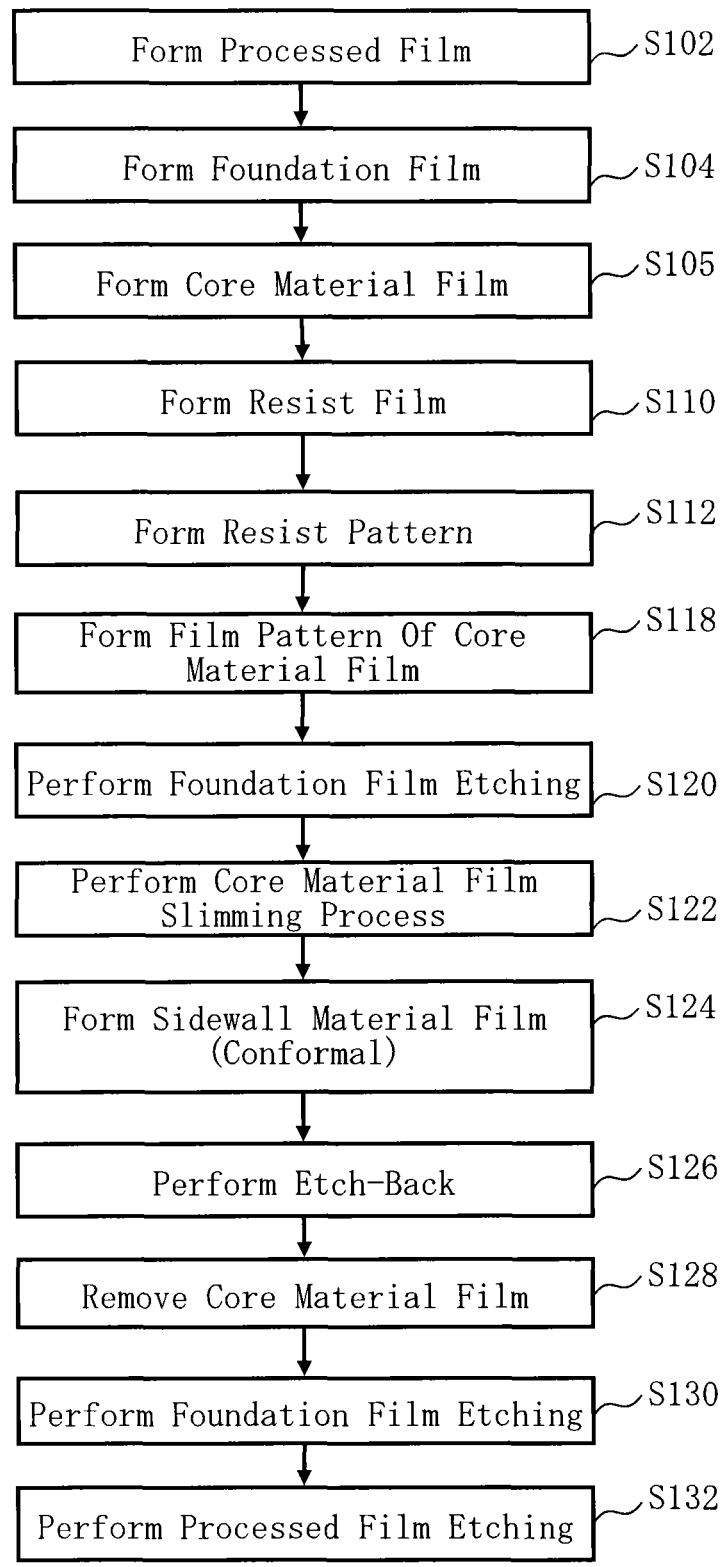
FIG. 7 is a flowchart showing principal part processes of the method for fabricating the semiconductor device according to a second embodiment.

FIG. 7 is a flowchart showing principal part processes of the method for fabricating the semiconductor device according to a second embodiment. FIG. 7 is the same as FIG. 1 except that a resist film formation process (S110) and a resist pattern formation process (S112) are added between the core material film formation process (S105) and the film pattern formation process (S118) of a core material film. Content that is not specifically described below is the same as in the first embodiment.

FIGS. 8A to 8D are process sectional views of the method for fabricating the semiconductor device according to the second embodiment. FIGS. 8A to 8D show the resist pattern formation process (S112) to the sidewall material film formation process (S124) in FIG. 7. Subsequent processes will be described later.

Figure 8A:
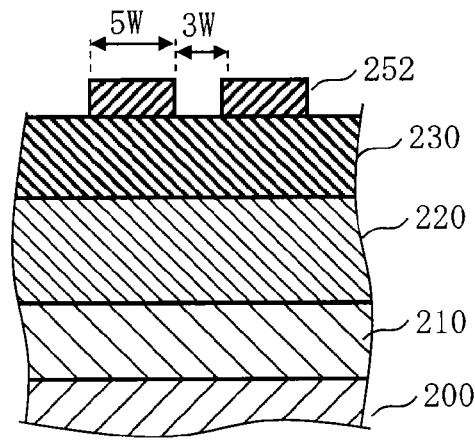
FIGS. 8A to 8D are process sectional views of the method for fabricating the semiconductor device according to the second embodiment.

In FIG. 8A, first each of the processed film formation process (S102) and the foundation film formation process (S104) is executed in the same manner as in the first embodiment.

Next, the core material film formation process (S105) is executed. In the core material film formation process (S105) according to the second embodiment, a material of the same type as that of the processed film 210 is used for the core material film 230. Here, for example, an $SiO_2$ film is formed by using the CVD method or the coating process. Other content is the same as in the first embodiment.

As the resist film formation process (S110), a resist film (an example of the fourth film) is formed on the core material film 230 by using the coating process.

Next, as the resist pattern formation process (S112), a resist pattern 252 to be a substantially 5:3 line & space pattern is formed by exposing and developing the resist film. By processing the resist film (the example of the fourth film) in this manner, the resist pattern 252 as film patterns of the resist film are formed. In the second embodiment, like in the first embodiment, a substantially 1:1 line & space pattern of the width dimension W is formed as a hard mask in the end. FIG. 8A shows an example of forming a line pattern having the width 5 W, which is five times the width dimension W, and a space pattern having the width 3 W, which is three times the width dimension W. It is needless to say that such sizes of 5 W and 3 W are sizes more than the resolution limit of exposure light.

Figure 8B:
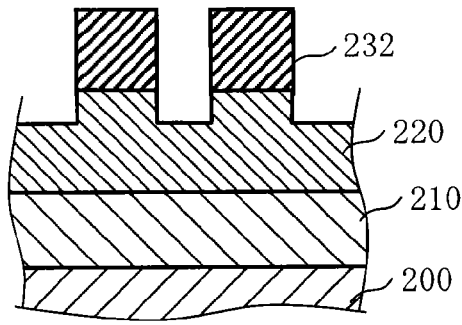

In FIG. 8B, as the film pattern formation process (S118) of a core material film, the core material film 230 is etched by using the resist pattern 252 as a mask. The film patterns 232 to be a substantially 5:3 line & space pattern are thereby formed in the core material film 230.

Next, as the foundation film etching process (S120), the foundation film 220 is etched by using the film patterns 232 of the core material film 230 as a mask. Other content is the same as in the first embodiment.

Here, an example in which etching of the core material film 230 and etching of the foundation film 220 are performed separately is shown, but the present embodiment is not limited to such an example. Both of the core material film 230 and the foundation film 220 may be etched together by using the resist pattern 252 as a mask. When the foundation film 220 is etched together, the foundation film 220 may be over-etched so that a step is formed thereon.

Figure 8C:
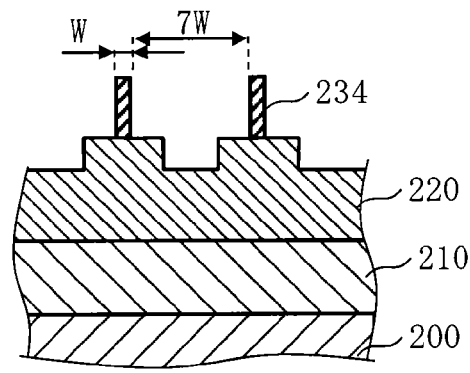

In FIG. 8C, as the core material film slimming process (S122), a slimming process of the film patterns 232 of the core material film 230 is performed to form the film patterns 234 whose width are narrower than that of the film patterns 221 of the foundation film 220 on the foundation film 220. For example, a buffered HF (BHF) may be used as the etchant to slim the film patterns 232 by the wet etching process. Alternatively, the film patterns 232 may be slimmed by the dry etching process in a halogen containing gas (for example, a $C_4F_8$ gas). Here, the film patterns 234 are formed by slimming the film patterns 232 having the dimension of the exposure size 5 W to the dimension W, which are substantially ⅕ the exposure size. By performing the slimming process of the film patterns 232 of the core material film 230, the film patterns 234 of the core material film 230 to be a substantially 1:7 line & (and) space pattern are formed.

Figure 8D:
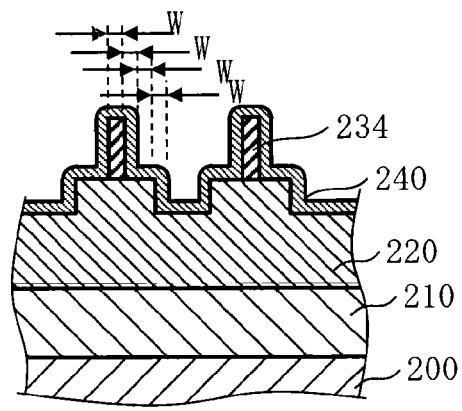

In FIG. 8D, as the sidewall material film formation process (S124), the sidewall material film 240 (third film) is conformally formed by using, for example, the CVD method as if to cover the foundation film 220 and the film patterns 234 of the core material film 230. A material whose etching selection ratio with respect to the foundation film 220 is high is suitably used for the sidewall material film 240. In the second embodiment, for example, a carbon (C) film or metal containing film is suitably used. For example, an AlN film is suitably used as the metal containing film.

Hereinafter, the etch-back process (S126) to the foundation film etching process (S130) are executed in the same manner as in the first embodiment. In the core material film removal process (S128), an $SiO_2$ film is used as the core material film 230 in the second embodiment and thus, the core material film 230 may be removed by the wet etching process using buffered HF (BHF) as the etchant. Alternatively, the core material film 230 may be removed by the dry etching process using a halogen containing gas (for example, a $C_4F_8$ gas).

From the above, like in the first embodiment, a substantially 1:1 line & space pattern of the dimension W, which is substantially ⅕ the line pattern size 5 W of a resist pattern formed by lithography, is formed, as shown in FIG. 4A, by the film patterns 242 of the sidewall material film 240 formed on both sidewalls of the film patterns 221 of the foundation film 220, the film patterns 244 of the sidewall material film 240 formed on both sidewalls of the film patterns 234 of the core material film 230, and film patterns of the foundation film 220 formed by transfer of these film patterns.

Third Embodiment

A resist film is used as the core material in the first embodiment, but the core material is not limited to the resist film. In the third embodiment, a case when a carbon film is used as the core material will be described. In addition, a configuration in which a core material film is processed by using a multi-layer mask will be described. The third embodiment will be described below by using the drawings.

Figure 9:
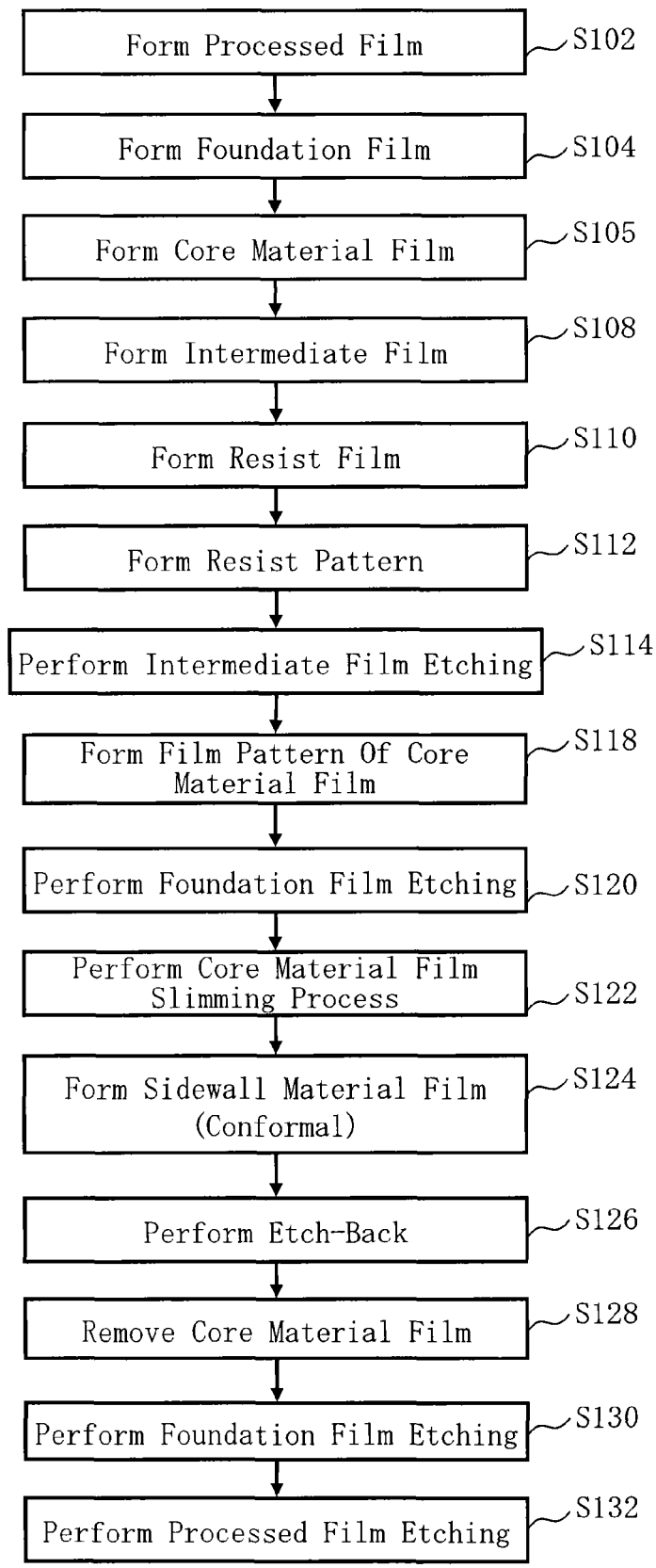
FIG. 9 is a flowchart showing principal part processes of the method for fabricating the semiconductor device according to a third embodiment.

FIG. 9 is a flowchart showing principal part processes of the method for fabricating the semiconductor device according to a third embodiment. FIG. 9 is the same as FIG. 1 except that an intermediate film formation process (S108), the resist film formation process (S110), the resist pattern formation process (S112), and an intermediate film etching process (S114) are added between the core material film formation process (S105) and the film pattern formation process (S118) of a core material film. Content that is not specifically described below is the same as in the first embodiment.

FIGS. 10A to 10D are process sectional views of the method for fabricating the semiconductor device according to the third embodiment. FIGS. 10A to 10D show the resist pattern formation process (S112) to the foundation film etching process (S120) in FIG. 9.

Figure 10A:
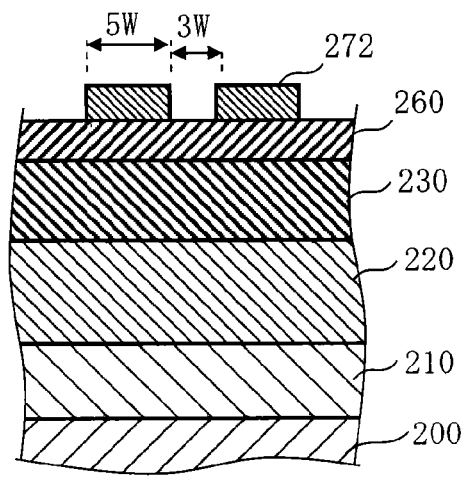
FIGS. 10A to 10D are process sectional views of the method for fabricating the semiconductor device according to the third embodiment.

In FIG. 10A, first each of the processed film formation process (S102) and the foundation film formation process (S104) is executed in the same manner as in the first embodiment.

Next, the core material film formation process (S105) is executed. In the core material film formation process (S105) according to the third embodiment, a carbon (C) film is formed as the core material film 230 by using the coating process or the CVD method. Other content is the same as in the first embodiment.

Next, as the intermediate film formation process (S108), an intermediate film 260 (an example of the fourth film) is formed on the core material film 230. A material having a high etching selection ratio with respect to the core material film 230 may be used for the intermediate film 260.

Next, as the resist film formation process (S110), a resist film (an example of the fifth film) is formed on the intermediate film 260 by using the coating process.

Next, as the resist pattern formation process (S112), a resist pattern 272 to be a substantially 5:3 line & space pattern is formed by exposing and developing the resist film. By processing the resist film (the example of the fifth film) in this manner, the resist pattern 272 as film patterns of the resist film is formed. In the third embodiment, like in the first embodiment, a substantially 1:1 line & space pattern of the width dimension W is formed as a hard mask in the end. FIG. 10A shows an example of forming a line pattern having the width 5 W, which is five times the width dimension W, and a space pattern having the width 3 W, which is three times the width dimension W. It is needless to say that such sizes of 5 W and 3 W are sizes more than the resolution limit of exposure light.

Figure 10B:
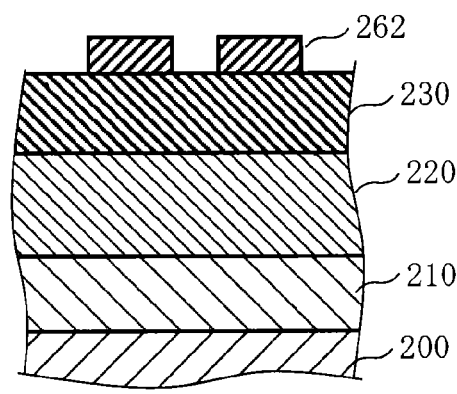

In FIG. 10B, as the intermediate film etching process (S114), the intermediate film 260 is etched by using the resist pattern 272 as a mask. Film patterns 262 to be a substantially 5:3 line & space pattern are thereby formed in the intermediate film 260.

Figure 10C:
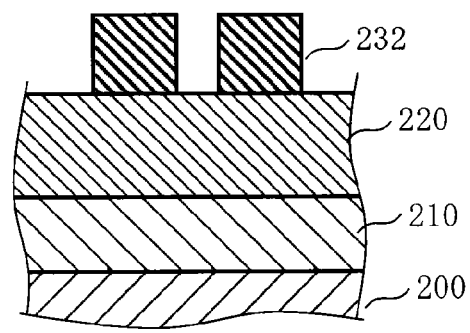

In FIG. 10C, as the film pattern formation process (S118) of a core material film, the core material film 230 is etched by using the film patterns 262 of the intermediate film 260 as a hard mask. The film patterns 232 to be a substantially 5:3 line & space pattern is thereby formed in the core material film 230.

Figure 10D:
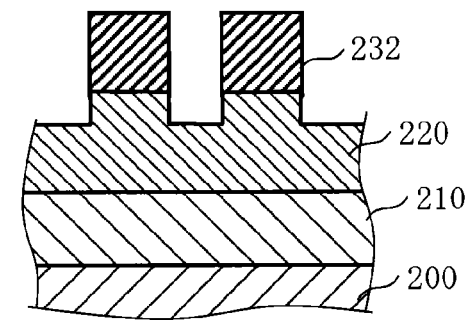

In FIG. 10D, as the foundation film etching process (S120), the foundation film 220 is etched by using the film patterns 232 of the core material film 230 as a mask. Other content is the same as in the first embodiment.

Here, an example in which etching of the intermediate film 260 and etching of the core material film 230 are performed separately is shown, but the present embodiment is not limited to such an example. Both of the intermediate film 260 and the core material film 230 may be etched together by using the resist pattern 272 as a mask. Further, the intermediate film 260, the core material film 230, and the foundation film 220 may be etched together by using the resist pattern 272 as a mask. When the foundation film 220 is etched together, the foundation film 220 may be over-etched so that a step is formed thereon.

Hereinafter, the core material film slimming process (S122) to the foundation film etching process (S130) are executed in the same manner as in the first embodiment. A C film is used as the core material film 230 in the third embodiment and thus, in the core material film slimming process (S122), the film patterns 232 of the core material film 230 may be slimmed by the wet etching process using, for example, SPM as the etchant. Alternatively, the film patterns 232 may be slimmed by the dry etching process using an $O_2$ gas. Also in the core material film removal process (S128), SPM may be used as the etchant to remove the film patterns 234 by the wet etching process. Alternatively, the film patterns 234 may be removed by the dry etching process using an $O_2$ gas.

In the sidewall material film formation process (S124), a metal containing film is suitably used as the sidewall material film 240. For example, an AlN film is suitably used as the metal containing film. When the sidewall material film 240 is formed, it is suitable to form the sidewall material film 240 at temperature of formation of the C film as the core material film 230 or less.

From the above, like in the first embodiment, a substantially 1:1 line & space pattern of the dimension W, which is substantially ⅕ the line pattern size 5 W of a resist pattern formed by lithography, is formed, as shown in FIG. 4A, by the film patterns 242 of the sidewall material film 240 formed on both sidewalls of the film patterns 221 of the foundation film 220, the film patterns 244 of the sidewall material film 240 formed on both sidewalls of the film patterns 234 of the core material film 230, and film patterns of the foundation film 220 formed by transfer of these film patterns.

Fourth Embodiment

A resist film is used as the core material in the first embodiment, but the core material is not limited to the resist film. In the fourth embodiment, a case when a material other than the resist film is used as the core material will be described. In addition, a configuration in which a core material film is processed by using a multi-layer mask will be described. The fourth embodiment will be described below by using the drawings.

Figure 11:
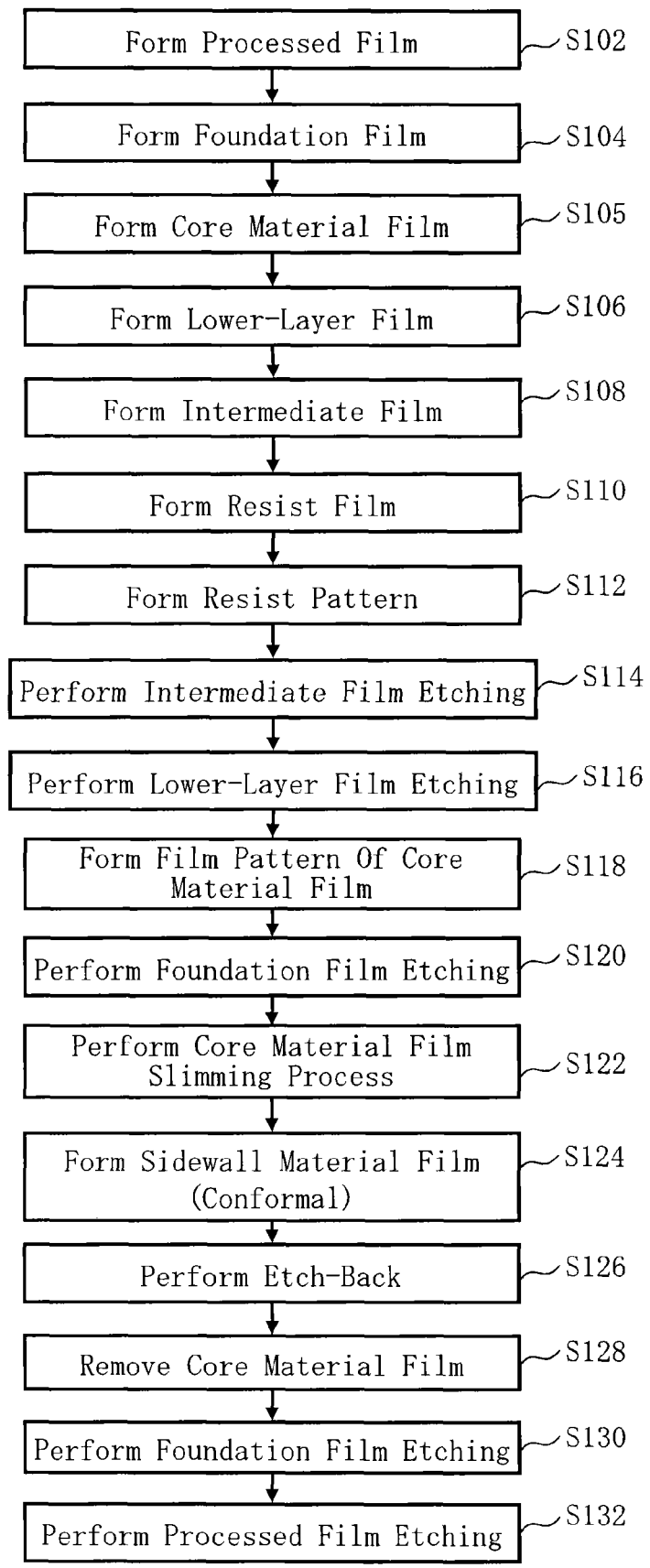
FIG. 11 is a flowchart showing principal part processes of the method for fabricating the semiconductor device according to a fourth embodiment.

FIG. 11 is a flowchart showing principal part processes of the method for fabricating the semiconductor device according to a fourth embodiment. FIG. 11 is the same as FIG. 1 except that a lower-layer film formation process (S106), the intermediate film formation process (S108), the resist film formation process (S110), the resist pattern formation process (S112), the intermediate film etching process (S114), and a lower-layer film etching process (S116) are added between the core material film formation process (S105) and the film pattern formation process (S118) of a core material film. Content that is not specifically described below is the same as in the first embodiment.

FIGS. 12A to 12D are process sectional views of the method for fabricating the semiconductor device according to the fourth embodiment. FIGS. 12A to 12D show the resist pattern formation process (S112) to the film pattern formation process (S118) of a core material film.

Figure 12A:
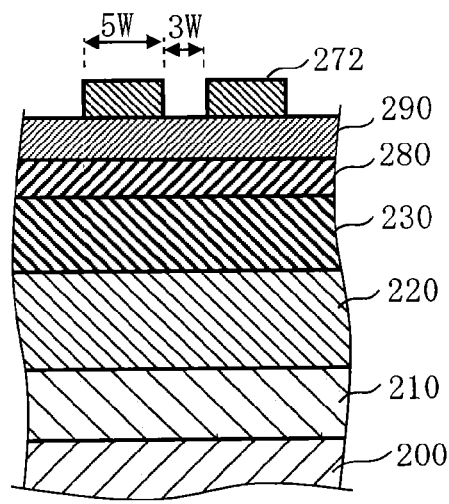
FIGS. 12A to 12D are process sectional views of the method for fabricating the semiconductor device according to the fourth embodiment.

In FIG. 12A, first each of the processed film formation process (S102) and the foundation film formation process (S104) is executed in the same manner as in the first embodiment.

Next, the core material film formation process (S105) is executed. In the core material film formation process (S105) according to the fourth embodiment, an $SiO_2$ film is used as the core material film 230. Other content is the same as in the first embodiment.

Next, as the lower-layer film formation process (S106), a lower-layer film 280 (an example of the fourth film) is formed on the core material film 230. A material having a high etching selection ratio with respect to the core material film 230 may be used for the lower-layer film 280.

Next, as the intermediate film formation process (S108), an intermediate film 290 (an example of the fifth film) is formed on the lower-layer film 280. A material having a high etching selection ratio with respect to the lower-layer film 280 may be used for the intermediate film 290.

Next, as the resist film formation process (S110), a resist film (an example of the sixth film) is formed on the intermediate film 290 by using the coating process.

Next, as the resist pattern formation process (S112), a resist pattern 272 to be a substantially 5:3 line & space pattern is formed by exposing and developing the resist film. By processing the resist film (an example of the sixth film) in this manner, the resist pattern 272 as film patterns of the resist film is formed. In the fourth embodiment, like in the first embodiment, a substantially 1:1 line & space pattern of the width dimension W is formed as a hard mask in the end. FIG. 12A shows an example of forming a line pattern having the width 5 W, which is five times the width dimension W, and a space pattern having the width 3 W, which is three times the width dimension W. It is needless to say that such sizes of 5 W and 3 W are sizes more than the resolution limit of exposure light.

Figure 12B:
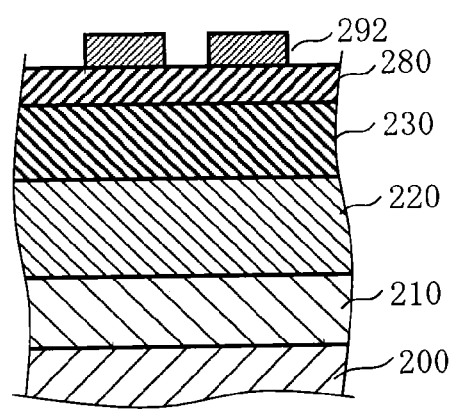

In FIG. 12B, as the intermediate film etching process (S114), the intermediate film 290 is etched by using the resist pattern 272 as a mask. A film patterns 292 to be a substantially 5:3 line & space pattern are thereby formed in the intermediate film 290.

Figure 12C:
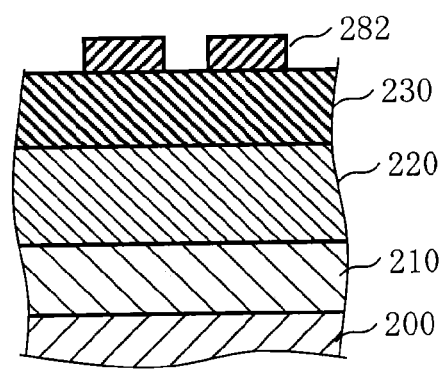

In FIG. 12C, as the lower-layer film etching process (S116), the lower-layer film 280 is etched by using the film patterns 292 of the intermediate film 290 as a hard mask. Film patterns 282 to be a substantially 5:3 line & space pattern are thereby formed in the lower-layer film 280.

Figure 12D:
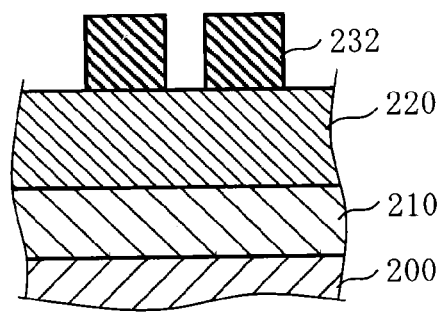

In FIG. 12D, as the film pattern formation process (S118) of a core material film, the core material film 230 is etched by using the film patterns 282 of the lower-layer film 280 as a hard mask. The film patterns 232 to be a substantially 5:3 line & space pattern are thereby formed in the core material film 230.

Hereinafter, the foundation film etching process (S120) to the foundation film etching process (S130) are executed in the same manner as in the first embodiment. An $SiO_2$ film is used as the core material film 230 in the fourth embodiment and thus, in the core material film slimming process (S122), the film pattern 232 of the core material film 230 may be slimmed by the wet etching process using, for example, BHF as the etchant. Alternatively, the film patterns 232 may be slimmed by the dry etching process in a halogen containing gas (for example, a $C_4F_8$ gas). Also in the core material film removal process (S128), BHF may be used as the etchant to remove the film patterns 234 by the wet etching process. Alternatively, the film patterns 234 may be removed by the dry etching process using a halogen containing gas (for example, a $C_4F_8$ gas).

Here, an example in which etching of the foundation film 220 and etching of the core material film 230 are performed separately is shown, but the present embodiment is not limited to such an example. Both of the core material film 230 and the foundation film 220 may be etched together by using the film patterns 282 of the lower-layer film 280 as a mask. When the foundation film 220 is etched together, the foundation film 220 may be over-etched so that a step is formed thereon.

In the sidewall material film formation process (S124), a C film or metal containing film is suitably used as the sidewall material film 240. For example, an AlN film is suitably used as the metal containing film.

From the above, like in the first embodiment, a substantially 1:1 line & space pattern of the dimension W, which is substantially ⅕ the line pattern size 5 W of a resist pattern formed by lithography, is formed, as shown in FIG. 4A, by the film patterns 242 of the sidewall material film 240 formed on both sidewalls of the film patterns 221 of the foundation film 220, the film patterns 244 of the sidewall material film 240 formed on both sidewalls of the film patterns 234 of the core material film 230, and film patterns of the foundation film 220 formed by transfer of these film patterns.

Fifth Embodiment

In an actual wiring pattern of a semiconductor device, a region in which the distance between adjacent wires is widened so that a wide hole pattern can be arranged is normally arranged to configure a semiconductor circuit by connecting wiring layers of upper and lower layers through a plug arranged in the hole pattern. In the fifth embodiment, a case when a hook-up in which a contact to connect wiring layers of upper and lower layers is arranged is formed by using one of the above embodiments will be described.

FIGS. 13A to 13D are top views showing a portion of principal part processes of a method for forming a hook-up according to a fifth embodiment.

Figure 13A:
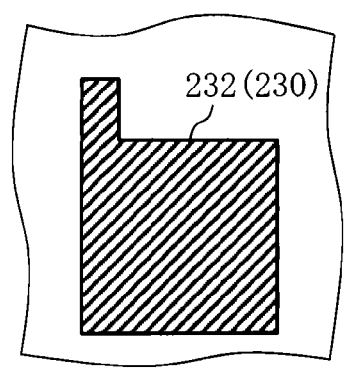
FIGS. 13A to 13D are top views showing a portion of principal part processes of a method for forming a hook-up according to a fifth embodiment.
Figure 13B:
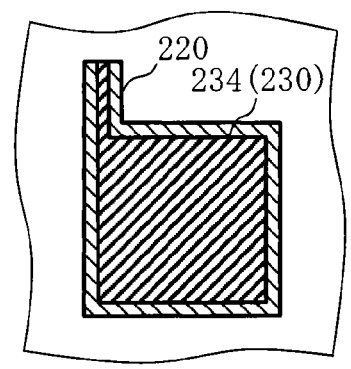
Figure 13C:
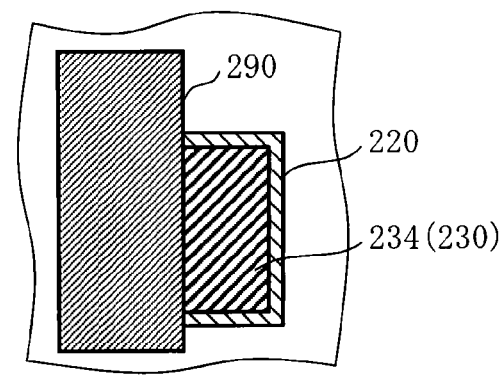
Figure 13D:
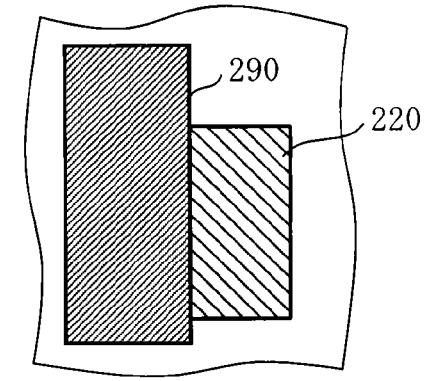

As shown in FIG. 13A, the film patterns 232 of the core material film 230 are formed by processing the core material film 230 as a wide rectangular pattern in the hook-up. In a wiring pattern portion (not shown), a line pattern in a substantially 5:3 line & space pattern similar to that in the above embodiments is formed by connecting to a rectangular pattern wider than a line pattern shown in FIG. 13A and extending. Then, after film patterns of the foundation film 220 being formed by using the film patterns 232 as a mask, the film patterns 232 of the core material film 230 are slimmed to form, as shown in FIG. 13B, the film patterns 234 of the core material film 230. Next, as shown in FIG. 13C, half the film patterns 234 of the core material film 230 formed as a wide rectangular pattern on one side are covered with the resist film 290. Then, as shown in FIG. 13D, the exposed film patterns 234 of the core material film 230 are removed by etching. The processing to selectively remove a portion of the wide pattern on the core material film 230 maybe performed before the slimming process on the core material film 230 after the film patterns 232 of the core material film 230 being transferred to the foundation film 220.

FIGS. 14A to 14D are top views showing another portion of principal part processes of the method for forming the hook-up according to the fifth embodiment.

Figure 14A:
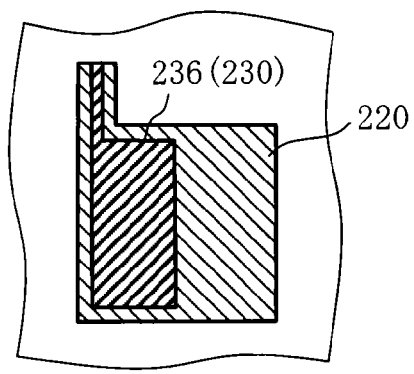
FIGS. 14A to 14D are top views showing another portion of principal part processes of the method for forming the hook-up according to the fifth embodiment.
Figure 14B:
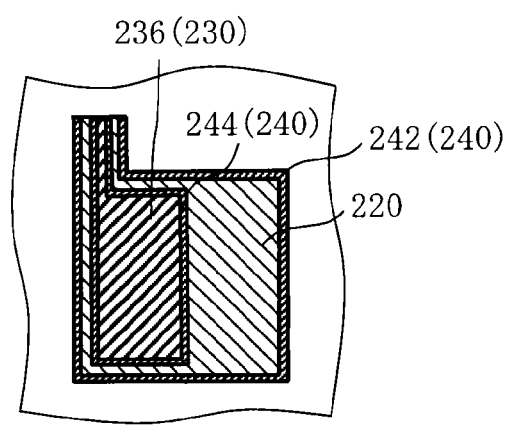

Next, as shown in FIG. 14A, the resist film 290 is removed. Then, the sidewall material film 240 is conformally formed as if to cover remaining film patterns 236 of the core material film 230 and the foundation film 220 and, as shown in FIG. 14B, film patterns 244 of the sidewall material film 240 are formed on the sidewall of the film patterns 236 of the core material film 230 by etching back until the surface of the core material film 230 and the foundation film 220 is exposed. At the same time, the film patterns 242 of the sidewall material film 240 is formed on the sidewall of the foundation film 220.

Figure 14C:
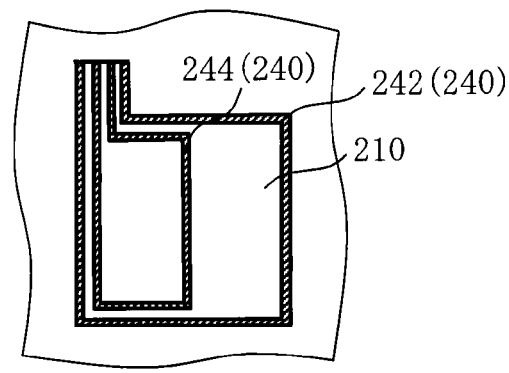
Figure 14D:
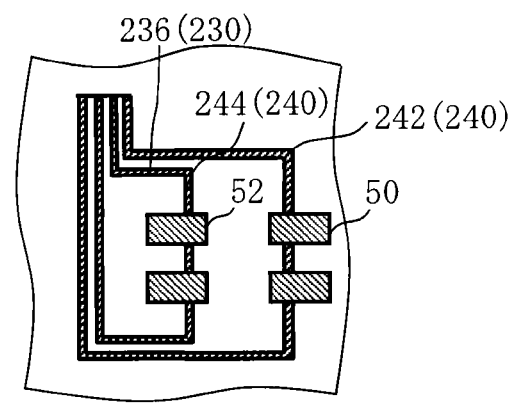

Next, by removing the core material film 230 and etching the foundation film 220 using the film patterns 242, 244 as masks, as shown in FIG. 14C, the film patterns 244 of the sidewall material film 240 formed around the film patterns 236 of the core material film 230 and to be a first wiring pattern and the film patterns 242 of the sidewall material film 240 formed around the foundation film 220 and to be a second wiring pattern can be formed on the processed film 210. Then, if the processed film 210 is etched by using the film patterns 242 and the film patterns 244 as hard masks, as shown in FIG. 14D, the hook-up in which contacts 50, 52 can be arranged can be formed.

Figure 15A:
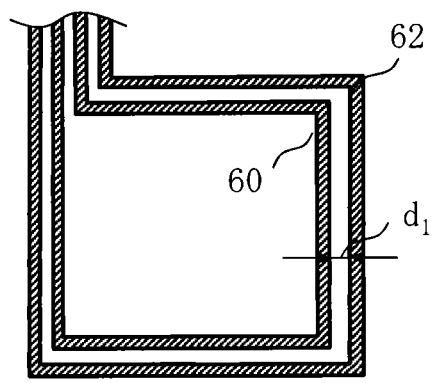
FIGS. 15A and 15B are conceptual diagrams illustrating differences when the hook-up is formed between the fifth embodiment and a comparative example.
Figure 15B:
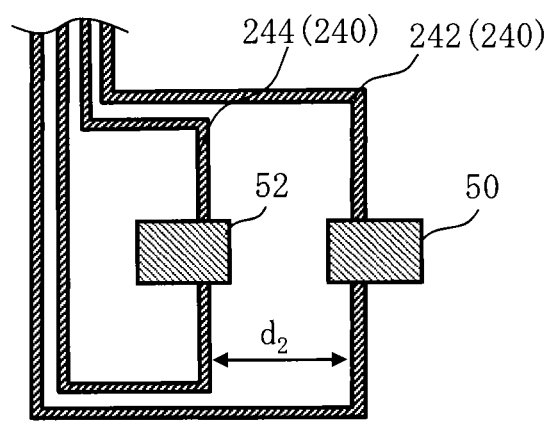

FIGS. 15A and 15B are conceptual diagrams illustrating differences when the hook-up is formed between the fifth embodiment and a comparative example.

When sidewall patterns 60, 62 are formed by repeating sidewall processing twice as comparison examples, as shown in FIG. 15A, it is difficult to arbitrarily widen a distance d1 between the sidewall patterns 60, 62 to be adjacent wiring patterns. In the fifth embodiment, by contrast, the shape of the core material film 230 on the foundation film 220 can be formed into any desired shape and thus, as shown in FIG. 15B, a distance d2 between the film patterns 242 of the sidewall material film 240 and the film patterns 244 of the sidewall material film 240 can be widened to any desired dimension. Therefore, wires can be formed in such a way that the contacts 50, 52 that are difficult to form without widening the distance between adjacent wires can be arranged. According to the fifth embodiment, as described above, a hook-up that is difficult to be formed by the method for forming a pattern that repeats sidewall processing twice can also be easily formed without complicating the pattern layout.

Figure 16A:
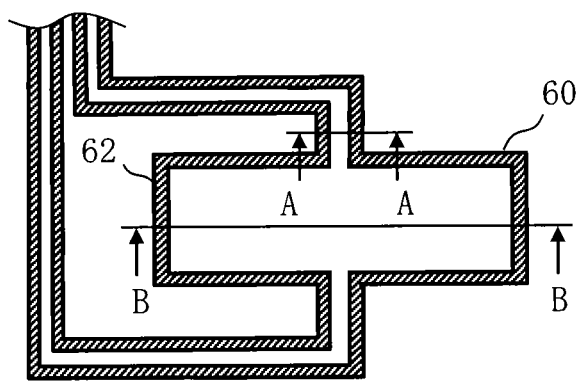
FIGS. 16A to 16C are conceptual diagrams illustrating a shape when the hook-up is formed according to the comparative example of the fifth embodiment.
Figure 16B:
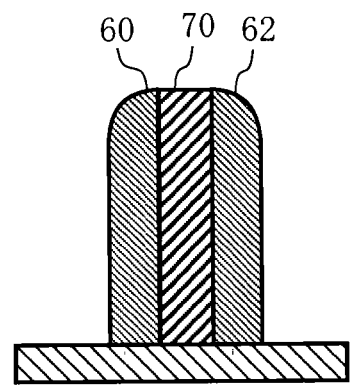
Figure 16C:
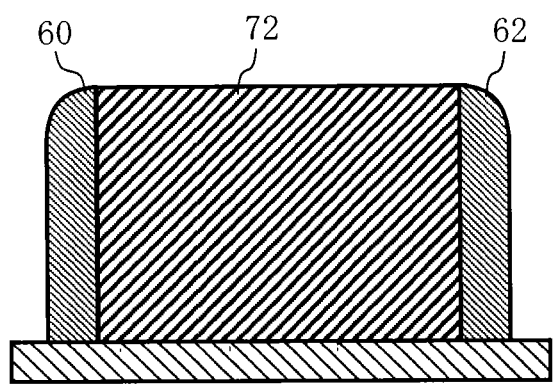

FIGS. 16A to 16C are conceptual diagrams illustrating the shape when the hook-up is formed according to the comparative example of the fifth embodiment. According to the method that repeats sidewall processing twice, as shown in FIGS. 16B and 16C, core material films 70, 72 are partially thickened to widen the distance between the sidewall patterns 60, 62 to be adjacent wiring patterns. However, in the method that repeats sidewall processing twice, the core material films 70, 72 in the second sidewall processing are sidewall patterns formed in the first sidewall processing and thus, it becomes necessary to add and form a thick-width pattern to be a new core material so as to overlap with the sidewall patterns formed in the first sidewall processing to partially thicken the core material films 70, 72. In this case, as shown in FIG. 16A, the sidewall patterns 60, 62 formed in the second sidewall processing become complicated with many folding portions.

Figure 17A:
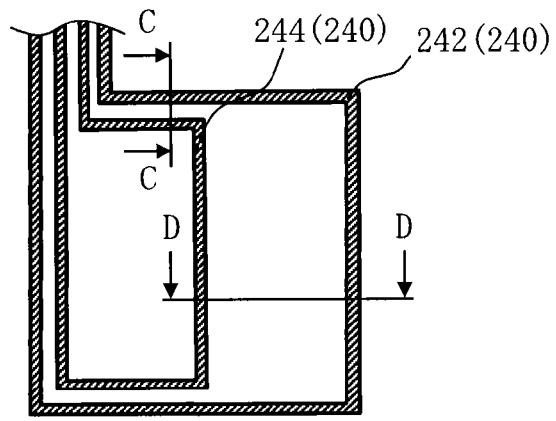
FIGS. 17A to 17C are conceptual diagrams illustrating a shape when the hook-up is formed according to the fifth embodiment.
Figure 17B:
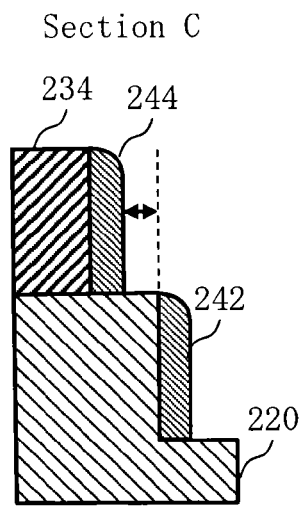
Figure 17C:
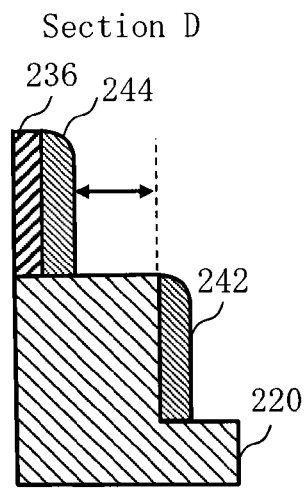

FIGS. 17A to 17C are conceptual diagrams illustrating the shape when the hook-up is formed according to the fifth embodiment. In the fifth embodiment, as shown in FIG. 17A, when widening the distance between the adjacent film patterns 242, 244 of the sidewall material film 240, the distance between the adjacent film patterns 242, 244 in a portion where the distance between the adjacent film patterns 242, 244 is narrow shown in FIG. 17B and the distance between the adjacent film patterns 242, 244 in a portion where the distance between the adjacent film patterns 242, 244 is wide shown in FIG. 17C can be controlled by adjusting the distance from an upper outer circumferential portion of the foundation film 220 to the film patterns 234, 236 of the core material film 230.

Therefore, according to the fifth embodiment, the interval between the film patterns 242 of the sidewall material film 240 formed on the sidewall of film patterns of the foundation film 220 and the film patterns 244 of the sidewall material film 240 formed on the sidewall of the film patterns 234, 236 of the core material film 230 can be controlled by controlling the distance between the sidewall of the film patterns of the foundation film 220 and the sidewalls of the film patterns 234, 236 of the core material film 230 after the slimming process on the foundation film 220.

According to the fifth embodiment, as described above, a hook-up that is difficult to be formed by the method for forming a pattern that repeats sidewall processing twice can also be easily formed without complicating the pattern layout.

In the foregoing, some embodiments have been described with reference to concrete examples. However, the embodiments are not limited to these concrete examples.

In addition, all methods for forming a pattern and all methods for fabricating a semiconductor device that include elements of the embodiments and whose design can be changed as appropriate by persons skilled in the art are included in the scope of the embodiments.

While techniques normally used in the semiconductor industry such as cleaning before and after treatment are not described for convenience of description, it is needless to say that such techniques are included in the scope of the embodiments.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A method for forming a pattern, comprising:
   forming a first film above a substrate;
   forming a second film above the first film;
   forming film patterns of the second film by processing the second film;
   forming film patterns of the first film by etching the first film halfway using the film patterns of the second film as a mask;
   converting the film patterns of the second film into film patterns whose width are narrower than the film patterns of the first film above the first film by performing a slimming process on the film patterns of the second film;
   forming film patterns of a third film on both sidewalls of the film patterns of the first film and on both sidewalls of the film patterns of the second film converted after the slimming process;
   removing the film patterns of the second film; and
   etching the first film using the film patterns of the third film as a mask after the film patterns of the second film being removed.

2. The method according to claim 1, wherein film patterns configured by the film patterns of the third film formed on the both sidewalls of the film patterns of the first film and the film patterns of the third film formed on the both sidewalls of the film patterns of the second film are arranged with a substantially constant pitch.

3. The method according to claim 1, wherein when the film patterns of the second film are formed, the film patterns of the second film are formed so as to be line patterns of a substantially 5:3 line and space pattern.

4. The method according to claim 3, wherein the film patterns of the second film are converted so as to be line patterns of a substantially 1:7 line and space pattern, by performing the slimming process on the film patterns of the second film.

5. The method according to claim 3, wherein the film patterns of the first film are formed so as to be line patterns of a substantially 5:3 line and space pattern, by etching the first film.

6. The method according to claim 3, wherein when the film patterns of the second film are formed, the film patterns of the second film are formed so as to have a wide pattern wider than the line patterns of the line and space pattern and a portion of the wide pattern in the second film is selectively removed after the film patterns of the first film are formed and before the film patterns of the third film are formed.

7. The method according to claim 1, wherein forming film patterns of a third film includes:
   forming the third film conformally so as to cover the film patterns of the first film and the film patterns of the second film after the slimming process of the film patterns of the second film; and
   performing etch-back processing of the third film conformally formed.

8. The method according to claim 1, wherein a silicon oxide ($SiO_2$) film is formed on a surface of the substrate and a carbon (C) film is used as the second film.

9. The method according to claim 1, wherein a silicon oxide ($SiO_2$) film is formed on a surface of the substrate and a resist film is used as the second film.

10. The method according to claim 1, wherein a silicon oxide ($SiO_2$) film is formed on a surface of the substrate and a metal containing film is used as the third film.

11. The method according to claim 1, wherein when the film patterns of the first film are formed, the first film is etched up to a surface of the substrate.

12. The method according to claim 11, wherein a material of a type different from a material of the surface of the substrate is used for the second film.

13. The method according to claim 1, wherein a material of a same type as a material of a surface of the substrate is used for the second film.

14. The method according to claim 13, wherein a silicon oxide ($SiO_2$) film is formed on the surface of the substrate and a $SiO_2$ film is used as the second film.

15. The method according to claim 1, further comprising:
forming a fourth film above the second film; and
forming film patterns of the fourth film by processing the fourth film,
wherein when the film patterns of the second film are formed, the second film is etched by using the film patterns of the fourth film as a mask.

16. The method according to claim 1, further comprising:
forming a fourth film above the second film;
forming a fifth film above the fourth film;
forming film patterns of the fifth film by processing the fifth film; and
etching the fourth film by using the film patterns of the fifth film as a mask,
wherein when the film patterns of the second film are formed, the second film is etched by using the fourth film etched as a mask.

17. The method according to claim 1, further comprising:
forming a fourth film above the second film;
forming a fifth film above the fourth film;
forming a sixth film above the fifth film;
forming film patterns of the sixth film by processing the sixth film;
etching the fifth film by using the film patterns of the sixth film as a mask; and
etching the fourth film by using the fifth film etched as a mask,
wherein when the film patterns of the second film are formed, the second film is etched by using the fourth film etched as the mask.

18. A method for fabricating a semiconductor device, comprising:
forming a film to be processed above a substrate;
forming a first film above the film to be processed;
forming a second film above the first film;
forming film patterns of the second film by processing the second film;
forming film patterns of the first film by etching the first film halfway using the film patterns of the second film as a mask;
converting the film patterns of the second film into film patterns whose width are narrower than the film patterns of the first film above the first film by performing a slimming process on the film patterns of the second film;
forming film patterns of a third film on both sidewalls of the film patterns of the first film and on both sidewalls of the film patterns of the second film converted after the slimming process;
removing the film patterns of the second film;
etching the first film by using the film patterns of the third film as a mask after the film patterns of the second film being removed; and
etching the film to be processed by using as masks the film patterns of the third film and the first film etched by using the film patterns of the third film as the mask.

19. The method according to claim 18, wherein an interval between the film patterns of the third film formed on at least one sidewall of the both sidewalls of the film patterns of the first film and the film patterns of the third film formed on at least one sidewall of the both sidewalls of the film patterns of the second film is controlled by controlling a distance between the sidewall of the film patterns of the first film and the sidewall of the film patterns of the second film above the first film after the slimming process.

* * * * *